US011837866B1

(12) United States Patent
Fang et al.

(10) Patent No.: US 11,837,866 B1
(45) Date of Patent: Dec. 5, 2023

(54) ESD PROTECTION APPARATUS AND CONTROL METHOD

(71) Applicant: Halo Microelectronics International, Campbell, CA (US)

(72) Inventors: Zhao Fang, Plano, TX (US); Gangqiang Zhang, Plano, TX (US); Wenchao Qu, Plano, TX (US)

(73) Assignee: Halo Microelectronics International, Campbell, CA (US)

( * ) Notice: Subject to any disclaimer, the term of this patent is extended or adjusted under 35 U.S.C. 154(b) by 21 days.

(21) Appl. No.: 17/855,293

(22) Filed: Jun. 30, 2022

(51) Int. Cl.
*H02H 9/04* (2006.01)
*H01L 27/02* (2006.01)

(52) U.S. Cl.
CPC ......... *H02H 9/046* (2013.01); *H01L 27/0266* (2013.01)

(58) Field of Classification Search
CPC ............................ H02H 9/046; H01L 27/0266
USPC .......................................................... 361/56
See application file for complete search history.

(56) References Cited

U.S. PATENT DOCUMENTS

| | | | | |
|---|---|---|---|---|
| 6,611,407 B1* | 8/2003 | Chang | ................. | H01L 27/0266 361/56 |
| 7,660,086 B2* | 2/2010 | Rodgers | ................. | H02H 9/046 361/111 |
| 8,576,524 B1* | 11/2013 | Zupcau | ................. | H02H 9/046 361/56 |
| 8,643,988 B1* | 2/2014 | Kwong | ................. | H02H 9/046 361/118 |
| 10,177,137 B1* | 1/2019 | Altolaguirre | ....... | H01L 27/0281 |
| 10,447,032 B2* | 10/2019 | Lu | ........... | H02H 9/008 |
| 10,749,336 B2* | 8/2020 | Mysore Rajagopal | ...... | H02H 9/046 |
| 11,482,858 B2* | 10/2022 | Watanabe | ........... | H01L 27/0292 |
| 11,527,530 B2* | 12/2022 | Mysore Rajagopal | ..... | H01L 27/0266 |
| 11,742,657 B2* | 8/2023 | Syu | ....... | H02H 9/046 361/56 |
| 2006/0262470 A1* | 11/2006 | Marum | ................. | H02H 9/046 361/56 |
| 2007/0285854 A1* | 12/2007 | Rodgers | ................. | H02H 9/046 361/56 |
| 2014/0368958 A1* | 12/2014 | Ikimura | ................. | H02H 9/046 361/56 |
| 2015/0333508 A1* | 11/2015 | Ko | ......... | H01L 23/60 361/56 |
| 2016/0172846 A1* | 6/2016 | Kotani | ..... | H02H 9/04 361/56 |
| 2021/0083471 A1* | 3/2021 | Watanabe | ............. | H02H 7/122 |
| 2022/0029623 A1* | 1/2022 | Bergsma | ......... | H03K 17/08122 |

(Continued)

FOREIGN PATENT DOCUMENTS

CN 109217276 A * 1/2019 ............. H02H 9/046
CN 113394212 A * 9/2021 ............. H02H 9/046

(Continued)

*Primary Examiner* — Dharti H Patel
(74) *Attorney, Agent, or Firm* — AP3 Law Firm PLLC

(57) ABSTRACT

An ESD protection apparatus includes a discharge resistor and a transistor connected in series between a first voltage rail and a second voltage rail, a first coupling capacitor, a diode and a first bias resistor connected in series between the first voltage rail and the second voltage rail, wherein a common node of the diode and the first bias resistor is connected to a gate of the transistor, and an ESD protection device connected between the first voltage rail and the second voltage rail.

20 Claims, 9 Drawing Sheets

(56) References Cited

U.S. PATENT DOCUMENTS

2022/0384420 A1* 12/2022 Ikeda ............... H01L 27/0266
2023/0093961 A1* 3/2023 Damodaran Prabha ...................
H02H 1/04
361/56

FOREIGN PATENT DOCUMENTS

JP       2000269437 A  *  9/2000  ......... H02H 27/0266
TW        202205775 A  *  2/2022  ............ H02H 9/046

* cited by examiner

US 11,837,866 B1

ESD PROTECTION APPARATUS AND CONTROL METHOD

TECHNICAL FIELD

The present invention relates to an ESD protection apparatus, and, in particular embodiments, to an ESD protection apparatus for a semiconductor chip.

BACKGROUND

As technologies further advance, a variety of computing devices such as laptops, mobile phones, tablet PCs, digital cameras, MP3 players and/or the like, have become popular. Each computer device comprises a plurality of integrated circuits packaged in a variety of semiconductor chips. The integrated circuits are susceptible to extremely high voltage spikes such as an electrostatic discharge (ESD) transient. ESD is a rapid discharge that flows between two objects due to the built-up of static charge. ESD may destroy integrated circuits because the rapid discharge can produce a relatively high voltage. ESD protection structures are needed for integrated circuits. In ESD protection, an ESD protection circuit is formed near integrated circuit terminals such as input and output signal terminals, power supply terminals and the like. ESD protection circuits may provide a current discharge path so as to reduce the semiconductor chip failures due to ESD.

FIG. 1 illustrates a traditional high-performance ESD protection circuit. A semiconductor device comprises a plurality of power supply terminals (e.g., S1 and S2 shown in FIG. 1) and a plurality of signal input/output terminals (e.g., IO1 and IO2 shown in FIG. 1). The plurality of power supply terminals and the plurality of signal input/output terminals share one ESD protection device 102. Each terminal (e.g., S1) is connected to an input bus of the ESD protection device 102 through a diode (e.g., D11), and is connected to ground through another diode (e.g., D12). The input bus of the ESD protection device 102 is alternatively referred to as an ESD rail.

As shown in FIG. 1, the ESD protection device 102 comprises a main transistor M0, a drive transistor M1, a first bias resistor R0, a second bias resistor R1 and a coupling capacitor C0. As shown in FIG. 1, M0 is connected between the ESD rail and ground. M1 and R0 are connected in series between the ESD rail and ground. A common node of M1 and R0 is connected to a gate of M0. C0 and R1 are connected in series between the ESD rail and ground. A common node of C0 and R1 is connected to a gate of M1.

In operation, the coupling capacitor C0 functions as a differentiating circuit. The coupling capacitor C0, as a differentiating circuit, is used to detect a sudden change of the voltage on the ESD rail. When the voltage on the ESD rail suddenly rises in response to an ESD pulse, the coupling capacitor C0 is able to convert the rate of the voltage change of the ESD pulse into a current flowing through R1. The voltage across R1 turns on the drive transistor M1. In response to the turn-on of M1, a current flows through R0. The current flowing through R0 establishes a gate bias voltage to turn on M0. After M0 has been turned on, the ESD rail is short-circuited to ground, thereby preventing the voltage on the ESD rail from exceeding the maximum voltage that each terminal can withstand. The ESD energy is dissipated in the on-resistance of M0. When the ESD pulse reaches the highest voltage, the coupling capacitor C0 no longer provides the current for keeping the drive transistor M1 to remain in the on state. The second bias resistor R1 rapidly discharges the gate of M1 to turn off the drive transistor M1. After the drive transistor M1 has been turned off, the first bias resistor R0 starts to discharge the gate of the main transistor M0. Once the gate voltage of M0 is below the turn-on threshold, M0 is turned off accordingly.

In order to perform ESD protection quickly and effectively, the main transistor M0 is implemented as a power transistor with a relatively small internal resistance and a relatively strong current capacity so as to achieve rapid dissipation of the energy of the ESD pulse. The current generated by the coupling capacitor C0 may be insufficient to directly turn on the main transistor M0 quickly. Therefore, it is necessary to add a driving stage comprising the drive transistor M1 and the first bias resistor R0 as a buffer to realize a fast turn-on of the main transistor M0. The turn-off speed of the main transistor M0 is mainly determined by the first bias resistor R0. A small resistance value of R0 can make the main transistor M0 turn off quickly after the ESD pulse reaches its peak, so as to reduce the conduction time of a large current flowing through the diode between the ESD pulse input terminal and the ESD rail. On the other hand, a large resistance value of R0 can delay the turn-off of the main transistor M0 so that the energy of the ESD pulse can be fully dissipated in M0, preventing possible damages caused by consecutive ESD pulses.

FIG. 2 illustrates a comparison between an ESD protection circuit having a small bias resistor and an ESD protection circuit having a large bias resistor after an ESD pulse is applied to a terminal of a semiconductor chip. The horizontal axis of FIG. 2 represents intervals of time. There may be three vertical axes. The first vertical axis Y1 represents the voltage on the ESD rail. The curve 201 represents the voltage on the ESD rail when a small bias resistor R0 is employed. The curve 202 represents the voltage on the ESD rail when a large bias resistor R0 is employed. The second vertical axis Y2 represents the gate-to-source voltage of M0. The curve 203 represents the gate-to-source voltage of M0 when a small bias resistor R0 is employed. The curve 204 represents the gate-to-source voltage of M0 when a large bias resistor R0 is employed. The third vertical axis Y3 represents the current flowing through M0. The curve 205 represents the current flowing through M0 when a small bias resistor R0 is employed. The curve 206 represents the current flowing through M0 when a large bias resistor R0 is employed.

At t0, in response to an ESD transient such as an ESD voltage pulse, the voltage on the ESD rail increases rapidly up to a voltage level of about 15 volts as shown in FIG. 2. In response to the sudden rise of the voltage on the ESD rail, the gate voltage of the main transistor M0 increases rapidly from zero volts to about 5 volts. In response to this gate voltage change, M0 is turned on. Once M0 is turned on, the current flowing through M0 also increases rapidly to a current level of about 2.8 amperes. In a short period of time after the ESD transient, the voltage of the ESD Rail starts to drop. Due to the different values of the first bias resistor R0, the time constant of the gate voltage drop of the main transistor M0 is also slightly different, and the duration of the voltage drop of the ESD rail is also different.

As shown in FIG. 2, when the resistance value of R0 is small, the main transistor M0 starts to turn off before the ESD pulse ends, thereby causing the remaining energy of the ESD pulse to continue to accumulate on the ESD rail. As indicated by the curve 201, the voltage of the ESD rail continues to rise after a brief drop. At t1, a stable voltage of about 25 volts is reached at the end of the ESD pulse. At this time, if there is a subsequent ESD pulse, the ESD protection circuit may not be triggered until the ESD pulse voltage is higher than 25 volts. If M0 continues to be turned off before the end of the ESD pulse, the voltage on the ESD rail will continue to accumulate until the circuits connected to the terminals are damaged due to overvoltage. In contrast, when the resistance value of R0 is large, the main transistor M0 continues to conduct for a longer time. As indicated by the curve 202, the voltage on the ESD rail continues to drop until it is close to zero.

In many applications, in order to protect the terminals and the circuits connected to the terminals, the first bias resistor R0 is usually of a larger resistance value to keep the ESD rail fully discharged. Depending on design needs, the ESD protection circuit shown in FIG. 1 may also be required to support the hot-swap function. In order to satisfy the requirements of these two functions (ESD and hot-swap), the selection of R0 will become very difficult. Specifically, in the hot-swap application, a power supply with a certain voltage is connected to the power terminal of the semiconductor chip. The instantaneous rise of the terminal voltage caused by the hot-swap power supply is similar to that caused by the ESD pulse. The ESD protection circuit cannot easily distinguish these two events. The ESD protection circuit may be triggered when the hot-swap power supply is connected to the power terminal. In the hot-swap application, the voltage applied to the ESD rail is a voltage step signal instead of a pulse signal. This results in that if the main transistor M0 of the ESD protection circuit cannot be turned off in a very short time, a high current continuously flows through the diode connected between the power terminal and the ESD rail. Such high current may cause excessive heat and damage the diode or the main ESD transistor M0.

FIG. 3 illustrates a comparison between an ESD protection circuit having a small bias resistor and an ESD protection circuit having a large bias resistor when a step voltage signal is applied to a terminal of a semiconductor chip. The horizontal axis of FIG. 3 represents intervals of time. There may be three vertical axes. The first vertical axis Y1 represents the voltage on the ESD rail. The curve 301 represents the voltage on the ESD rail when a small bias resistor R0 is employed. The curve 302 represents the voltage on the ESD rail when a large bias resistor R0 is employed. The second vertical axis Y2 represents the gate-to-source voltage of M0. The curve 303 represents the gate-to-source voltage of M0 when a small bias resistor R0 is employed. The curve 304 represents the gate-to-source voltage of M0 when a large bias resistor R0 is employed. The third vertical axis Y3 represents the current flowing through M0. The curve 305 represents the current flowing through M0 when a small bias resistor R0 is employed. The curve 306 represents the current flowing through M0 when a large bias resistor R0 is employed.

In operation, when the step voltage signal triggers the ESD protection circuit, the small bias resistor R0 can turn off the main transistor M0 quickly as indicated by the curve 303. The total power the main transistor M0 endures is limited, thereby not causing damage to the ESD protection circuit. However, if a large R0 is selected, the on time of the ESD protection circuit is much longer as indicated by the curve 304. The diode between the ESD rail and the power terminal where the step voltage signal is fed may need to carry high current for a long time, thereby causing damage to the ESD protection circuit.

The ESD protection and the hot-swap function have conflicting requirements for the value of the bias resistor R0. In many cases, it is difficult to find a suitable value of R0 to satisfy the requirements of these two functions. It is desirable to have a simple and reliable apparatus and control method to effectively protect integrated circuits from being damaged. The present disclosure addresses this need.

SUMMARY

These and other problems are generally solved or circumvented, and technical advantages are generally achieved, by preferred embodiments of the present disclosure which provide an ESD protection apparatus.

In accordance with an embodiment, an apparatus comprises a discharge resistor and a transistor connected in series between a first voltage rail and a second voltage rail, a first coupling capacitor and a diode connected in series between the first voltage rail and a gate of the transistor, an auxiliary transistor connected between the gate of the transistor and ground, and an ESD protection device connected between the first voltage rail and the second voltage rail.

In accordance with another embodiment, a method comprises configuring a discharge device to discharge a voltage on a first voltage rail upon detecting a voltage surge on the first voltage rail, wherein the discharge device comprises a discharge resistor and a transistor connected in series between the first voltage rail and a second voltage rail, configuring a diode to block a current from flowing from a gate of the transistor to the first voltage rail, and configuring a bias resistor or controlling an auxiliary transistor to discharge the gate of the transistor in a controllable manner so as to control an on time of the transistor.

In accordance with yet another embodiment, a semiconductor chip comprises a plurality of power supply terminals, a plurality of first upper diodes and a plurality of first lower diodes connected in series between a first voltage rail and a second voltage rail, wherein a common node of a first upper diode and a first lower diode adjacent to the first upper diode is connected to a corresponding power supply terminal, a plurality of signal input/output terminals, a plurality of second upper diodes and a plurality of second lower diodes connected in series between the first voltage rail and the second voltage rail, wherein a common node of a second upper diode and a second lower diode adjacent to the second upper diode is connected to a corresponding signal input/output terminal, an ESD protection device connected between the first voltage rail and the second voltage rail, and an auxiliary ESD protection device connected between the first voltage rail and the second voltage rail, wherein in response to a voltage surge on the first voltage rail, an on time of the auxiliary ESD protection device is greater than an on time of the ESD protection device.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely an ESD protection apparatus for a semiconductor chip. The invention may also be applied, however, to a variety of semiconductor systems and devices. Hereinafter, various embodiments will be explained in detail with reference to the accompanying drawings.

Figure 4:
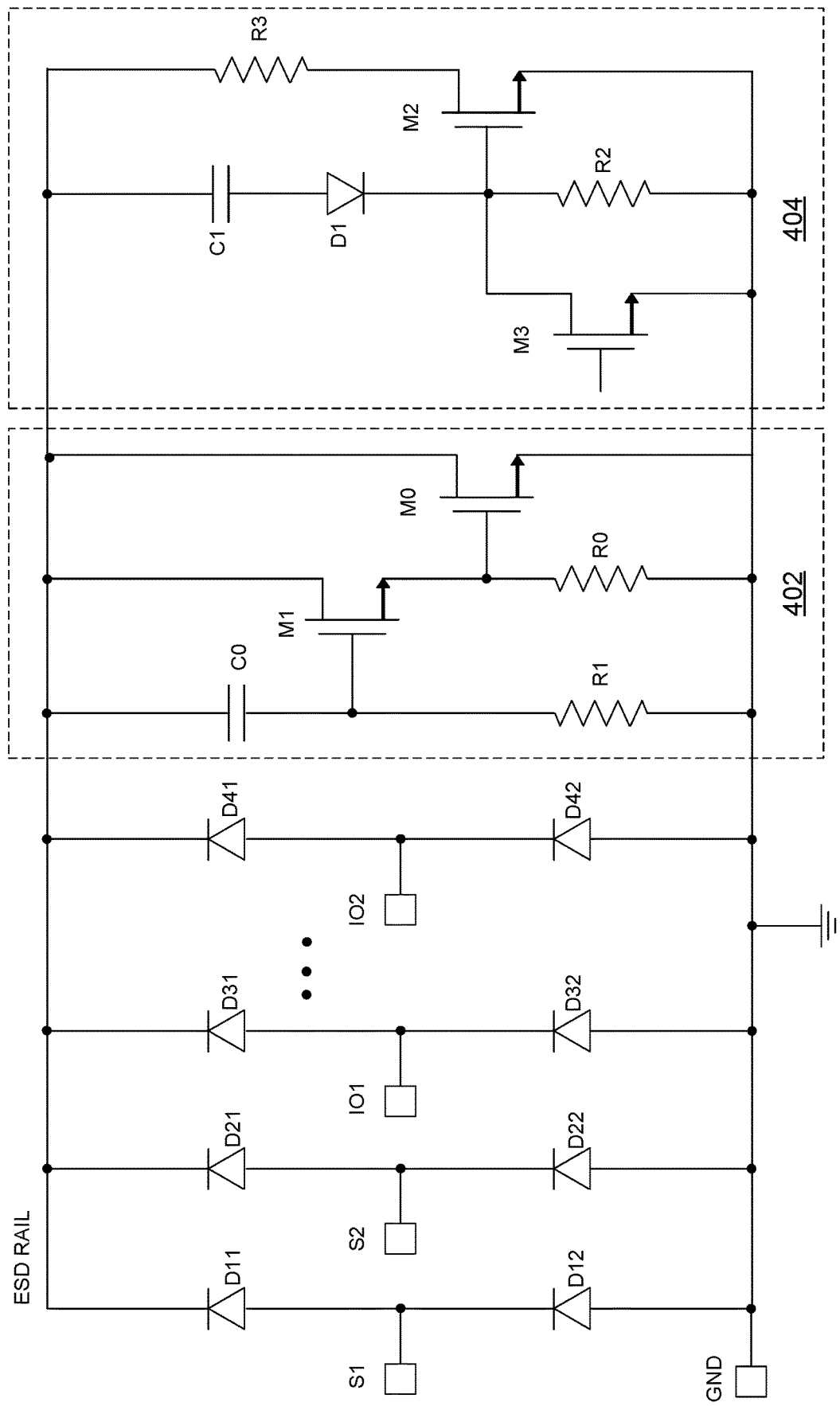
FIG. 4 illustrates a schematic diagram of a first implementation of an ESD protection apparatus in accordance with various embodiments of the present disclosure.

FIG. 4 illustrates a schematic diagram of a first implementation of an ESD protection apparatus in accordance with various embodiments of the present disclosure. The ESD protection apparatus is in a semiconductor chip. In some embodiments, the semiconductor chip comprises a plurality of power supply terminals (e.g., S1 and S2) and a plurality of signal input/output terminals (e.g., IO1 and IO2). It should be understood that the semiconductor chip may employ other terminals capable of processing other functions, two power supply terminals and two signal input/output terminals are illustrated for simplicity.

The semiconductor chip further comprises a plurality of first upper diodes (e.g., D11 and D21) and a plurality of first lower diodes (e.g., D12 and D22) connected in series between a first voltage rail and a second voltage rail. The first voltage rail is an ESD rail as shown in FIG. 4. The second voltage rail is connected to ground (GND). As shown in FIG. 4, cathodes of the plurality of first upper diodes (e.g., D11 and D21) are connected to the first voltage rail. Anodes of the plurality of first lower diodes (e.g., D12 and D22) are connected to the second voltage rail. As shown in FIG. 4, a common node of a first upper diode (e.g., D11) and a first lower diode (e.g., D12) adjacent to the first upper diode is connected to a corresponding power supply terminal (e.g., S1).

The semiconductor chip further comprises a plurality of second upper diodes (e.g., D31 and D41) and a plurality of second lower diodes (e.g., D32 and D42) connected in series between the first voltage rail and the second voltage rail. Cathodes of the plurality of second upper diodes (e.g., D32 and D42) are connected to the first voltage rail. Anodes of the plurality of second lower diodes (e.g., D32 and D42) are connected to the second voltage rail. A common node of a second upper diode (e.g., D31) and a second lower diode (e.g., D32) adjacent to the second upper diode is connected to a corresponding signal input/output terminal (e.g., IO1). It should be noted that FIG. 4 illustrates only two signal input/output terminals of the semiconductor chip that may include hundreds of such signal input/output terminals.

The semiconductor chip comprises two ESD discharge paths connected in parallel between the first voltage rail and the second voltage rail. A first ESD discharge path is formed by an ESD protection device 402. A second ESD discharge path is formed by an auxiliary ESD protection device 404. As shown in FIG. 4, the ESD protection device 402 and the auxiliary ESD protection device 404 are connected between the first voltage rail and the second voltage rail. In response to a voltage surge on the first voltage rail, both ESD discharge paths are able to discharge the voltage surge. More particularly, the control circuits of the two ESD protection devices are configured such that an on time of the auxiliary ESD protection device 404 is greater than an on time of the ESD protection device 402.

The auxiliary ESD protection device 404 comprises a discharge resistor R3, a transistor M2, a first coupling capacitor C1, a diode D1, a first bias resistor R2 and an auxiliary transistor M3. As shown in FIG. 4, the discharge resistor R3 and the transistor M2 are connected in series between the first voltage rail and the second voltage rail. The first coupling capacitor C1, the diode D1 and a first bias resistor R2 are connected in series between the first voltage rail and the second voltage rail. A common node of the diode D1 and the first bias resistor R2 is connected to the gate of the transistor M2. The auxiliary transistor M3 is connected in parallel with the first bias resistor R2. The auxiliary transistor M3 is configured to shut down the transistor M2 in response to a shutdown signal.

In some embodiments, the transistor M2 is an n-type transistor having a drain connected to the discharge resistor R3 and a source connected to ground. An anode of the diode D1 is connected to the first coupling capacitor C1. A cathode of the diode D1 is connected to the gate of the transistor M2.

As shown in FIG. 4, the ESD protection device 402 comprises an ESD transistor M0, a drive transistor M1, a second bias resistor R0, a second coupling capacitor C0 and a third bias resistor R1. The ESD transistor M0 is connected between the first voltage rail and the second voltage rail. The drive transistor M1 and the second bias resistor R0 are connected in series between the first voltage rail and the second voltage rail. A common node of the drive transistor M1 and the second bias resistor R0 is connected to the gate of the ESD transistor M0. The second coupling capacitor C0 and the third bias resistor R1 are connected in series between the first voltage rail and the second voltage rail. A common node of the second coupling capacitor C0 and the third bias resistor R1 is connected to the gate of the drive transistor M1.

As shown in FIG. 4, the ESD transistor M0 is an n-type transistor having a drain connected to the first voltage rail and a source connected to the second voltage rail. The drive transistor M1 is an n-type transistor having a drain connected to the first voltage rail and a source connected to the second bias resistor R0.

Figure 1:
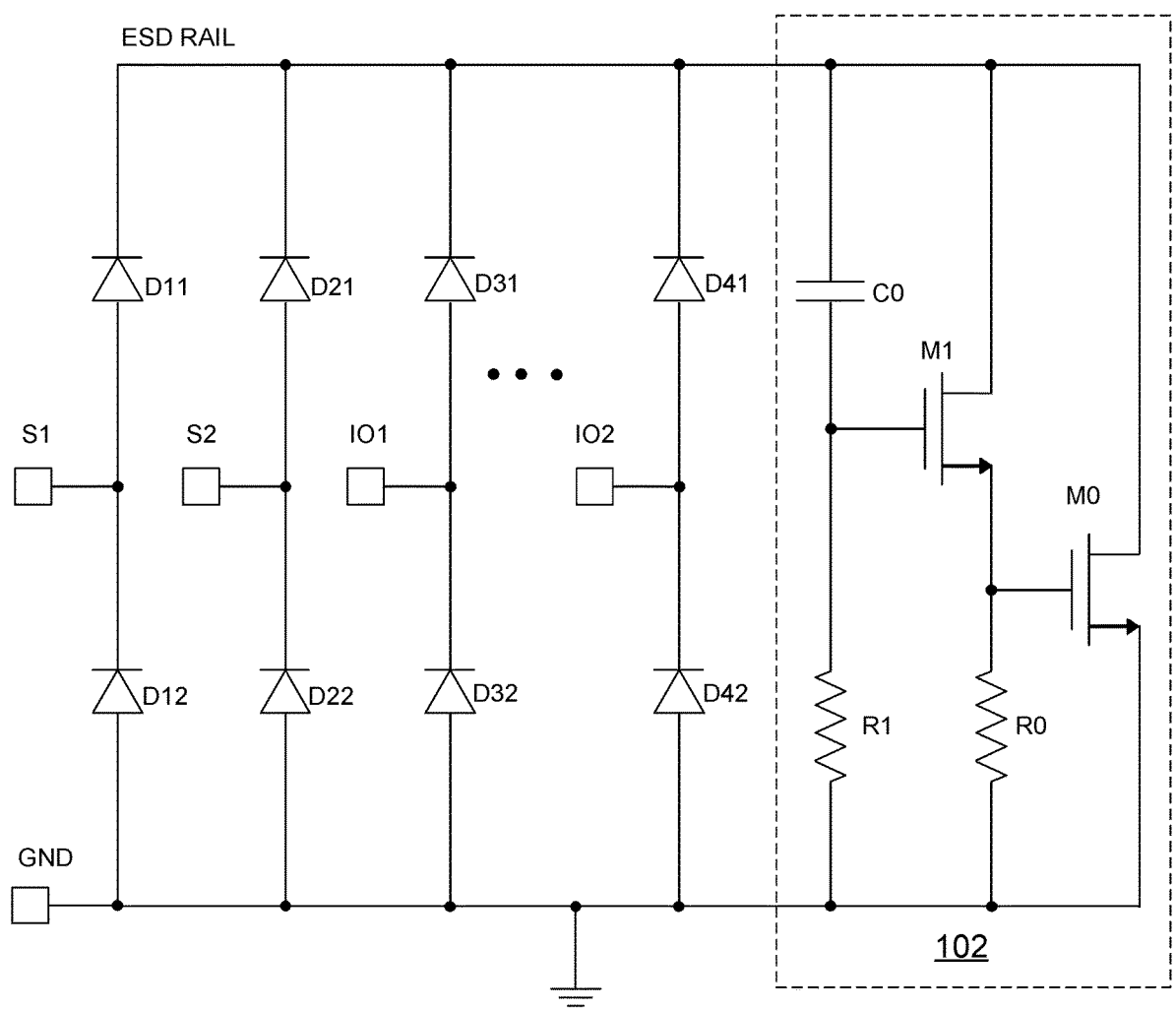
FIG. 1 illustrates a traditional high-performance ESD protection circuit.
Figure 2:
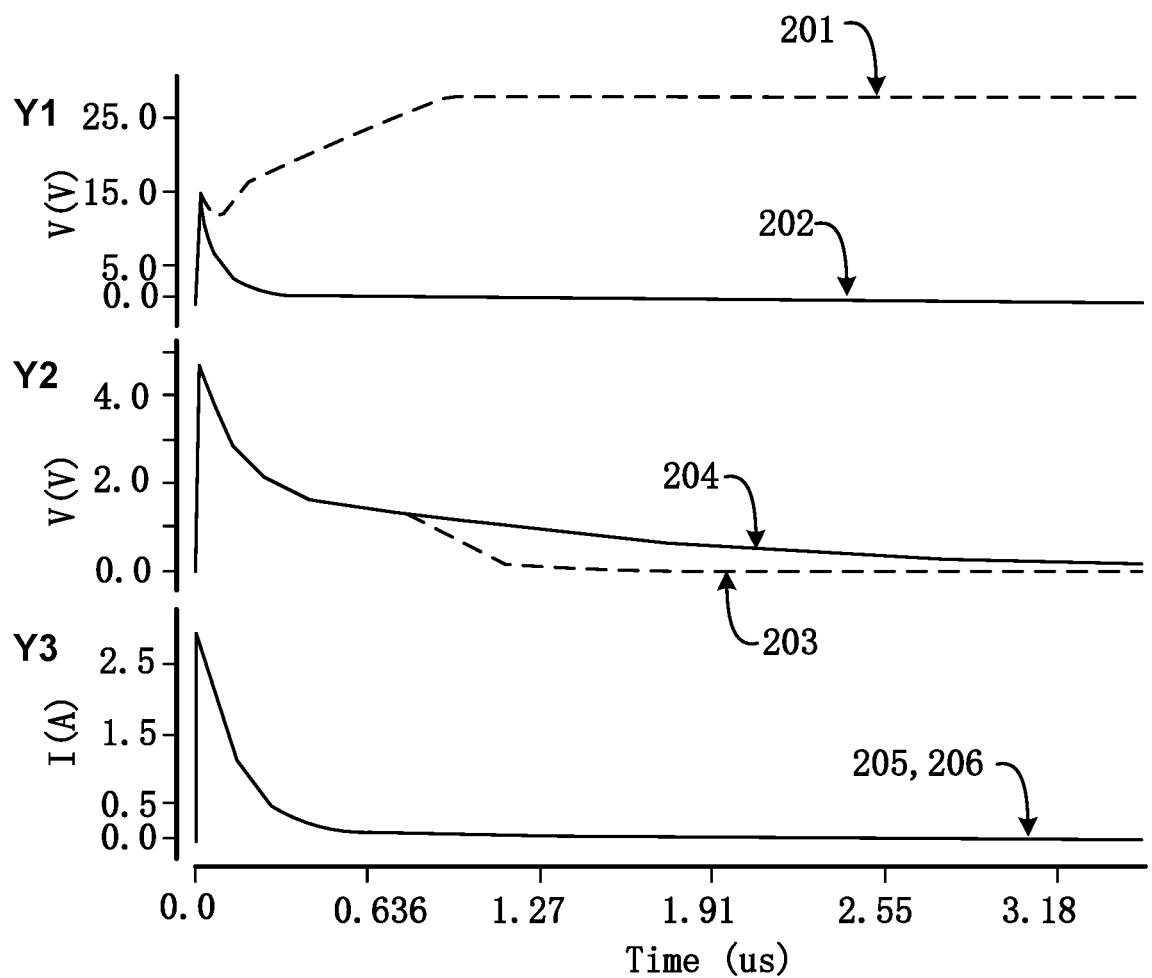
FIG. 2 illustrates a comparison between an ESD protection circuit having a small bias resistor and an ESD protection circuit having a large bias resistor after an ESD pulse is applied to a terminal of a semiconductor chip.
Figure 3:
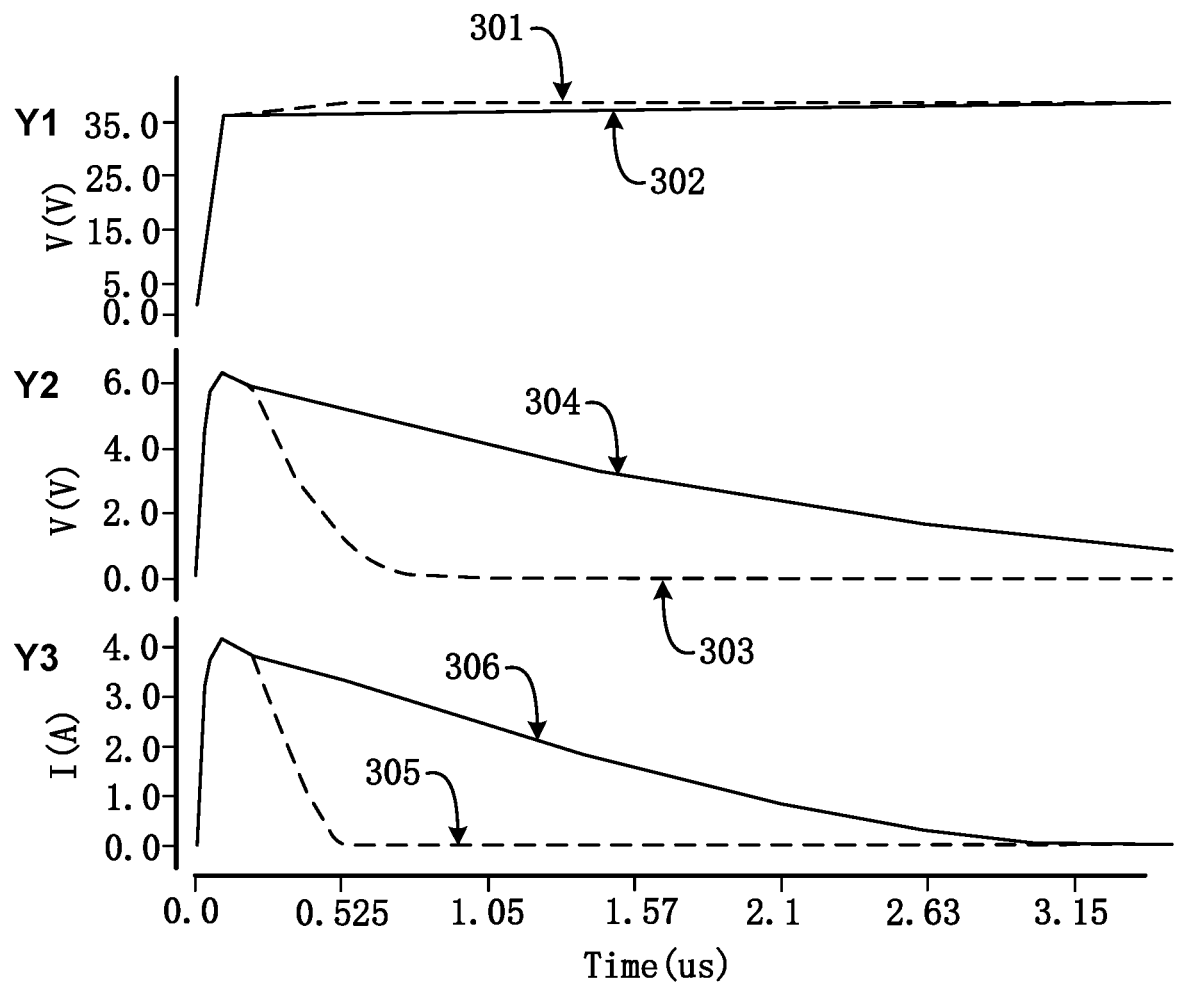
FIG. 3 illustrates a comparison between an ESD protection circuit having a small bias resistor and an ESD protection circuit having a large bias resistor when a step voltage signal is applied to a terminal of a semiconductor chip.

The operating principle of the ESD protection device 402 has been discussed in detail with respect to FIG. 1, and hence is not discussed again to avoid repetition.

In operation, the function of the first coupling capacitor C1 is similar to that of the second coupling capacitor C0. In particular, in response to a voltage surge (e.g., an ESD pulse) on the ESD rail, a current is generated by the first coupling capacitor C1. The current charges the gate terminal of M2 to form a gate drive voltage for M2. In response to this gate drive voltage, the transistor M2 is turned on. However, due to the introduction of the diode D1, the coupling capacitor C1 only responds to the rapid rise of the voltage on the ESD rail. When the voltage on the ESD rail drops rapidly, such as at the end of the ESD pulse, the diode D1 prevents the current from flowing from the gate of M2 to the ESD rail. The time for turning off M2 is determined by the first bias resistor R2 and/or the auxiliary transistor M3. The time for turning off M2 can be much longer than the duration of the ESD pulse. In some embodiments, the first bias resistor R2 can be used to alternatively represent the leakage resistance of the gate of the transistor M2. As such, a dedicated discharging resistor is not required.

The function of the transistor M2 is similar to that of the ESD transistor M0. When M2 is turned on, it discharges the ESD rail. Since the discharge resistor R3 functions as a current limiting resistor, the current flowing through M2 is much smaller than the current flowing through M0 when both M0 and M2 are turned on at the same time.

In operation, the main function of the second ESD discharge path comprising R3 and M2 is to keep M2 on for a period of time after M0 has been turned off such that prior to the arrival of a next ESD pulse, M2 is able to discharge the ESD rail to a low voltage (e.g., 0 V) with a relatively small current determined by R3. More particularly, through the selection of the appropriate resistance value of the first bias resistor R2, the gate of M2 can be slowly discharged so that M2 is able to remain on until the ESD rail is fully discharged prior to the arrival of the next ESD pulse. Since the ESD rail can be discharged by M2, R0 of the ESD protection device 402 can be implemented as a relatively small resistor so as to turn off M0 in a very short time to prevent thermal damages in the hot-swap applications.

In operation, when a hot-swap power supply is introduced, the two ESD discharge paths are activated at the same time. Because the value of R0 is small, M0 is turned off soon. At this time, the newly added M2 remains on to discharge the ESD rail. M2 is connected in series with R3. R3 can be selected to limit the current flowing through M2, thereby preventing M2 from being damaged.

In accordance with an embodiment, the transistors M0, M1 and M2 may be MOSFET devices. Alternatively, the switching element can be any controllable switches such as insulated gate bipolar transistor (IGBT) devices, integrated gate commutated thyristor (IGCT) devices, gate turn-off thyristor (GTO) devices, silicon controlled rectifier (SCR) devices, junction gate field-effect transistor (JFET) devices, MOS controlled thyristor (MCT) devices, gallium nitride (GaN) based power devices, silicon carbide (SiC) based power devices and the like.

It should be noted that the diagram shown in FIG. 4 is merely an example, which should not unduly limit the scope of the claims. One of ordinary skill in the art would recognize many variations, alternatives, and modifications. For example, one transistor of the ESD protection device that may include a plurality of transistors. The single transistor illustrated herein is limited solely for the purpose of clearly illustrating the inventive aspects of the various embodiments. The present disclosure is not limited to any specific number of transistors. Depending on different needs, the single transistor (e.g., M2) shown in FIG. 4 may be replaced by a plurality of transistors connected in parallel.

One advantageous feature of the auxiliary ESD protection device 404 shown in FIG. 4 is that the second ESD discharge path (M2) with a suitable current limitation (R3) introduced in the present disclosure can make the ESD protection circuit not only satisfy the protection of continuous ESD pulses, but also eliminate the risk of circuit damages caused by hot-swap power supplies.

Another advantageous feature of the auxiliary ESD protection device 404 shown in FIG. 4 is that the auxiliary transistor M3 is able to turn off M2 under a hot-swap application. For example, when a hot-swap power supply is connected to the semiconductor chip, M2 can be turned off by sending a shutdown signal to M3. Such an early shutdown of M2 helps to reduce the loss caused by the current flowing through M2.

Figure 5:
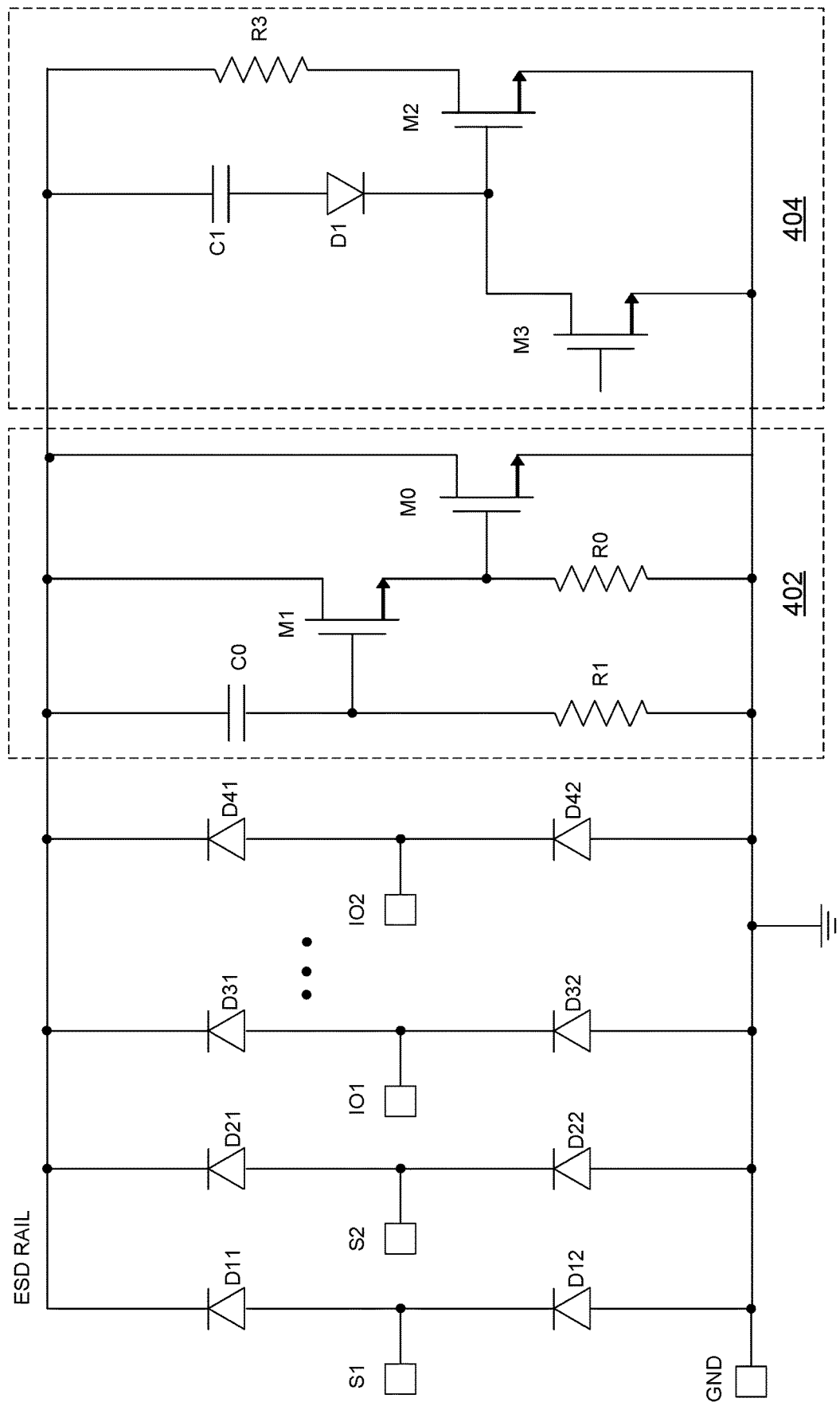
FIG. 5 illustrates a schematic diagram of a second implementation of an ESD protection apparatus in accordance with various embodiments of the present disclosure.

FIG. 5 illustrates a schematic diagram of a second implementation of an ESD protection apparatus in accordance with various embodiments of the present disclosure. The second implementation of the ESD protection apparatus is similar to the first implementation of the ESD protection apparatus shown in FIG. 4 except that R2 is not included. As shown in FIG. 5, the first coupling capacitor C1, the diode D1 and the auxiliary transistor M3 are connected in series between the first voltage rail and the second voltage rail. The turn-off of M2 is controlled by the auxiliary transistor M3.

In some embodiments, the auxiliary transistor M3 is controlled such that the gate voltage of M2 drops rapidly. For example, after a shutdown signal is fed into the gate of M3, the gate voltage of M2 is discharged in a short period of time, and M2 is turned off immediately.

In alternative embodiments, a modulation signal such as a PWM signal is applied to the gate of M3. The PWM signal is configured such that the gate voltage of M2 drops in a controllable manner. Under this configuration, M2 may function as a variable resistor. This variable resistor provides one more variable to control the current flowing through M2.

Figure 6:
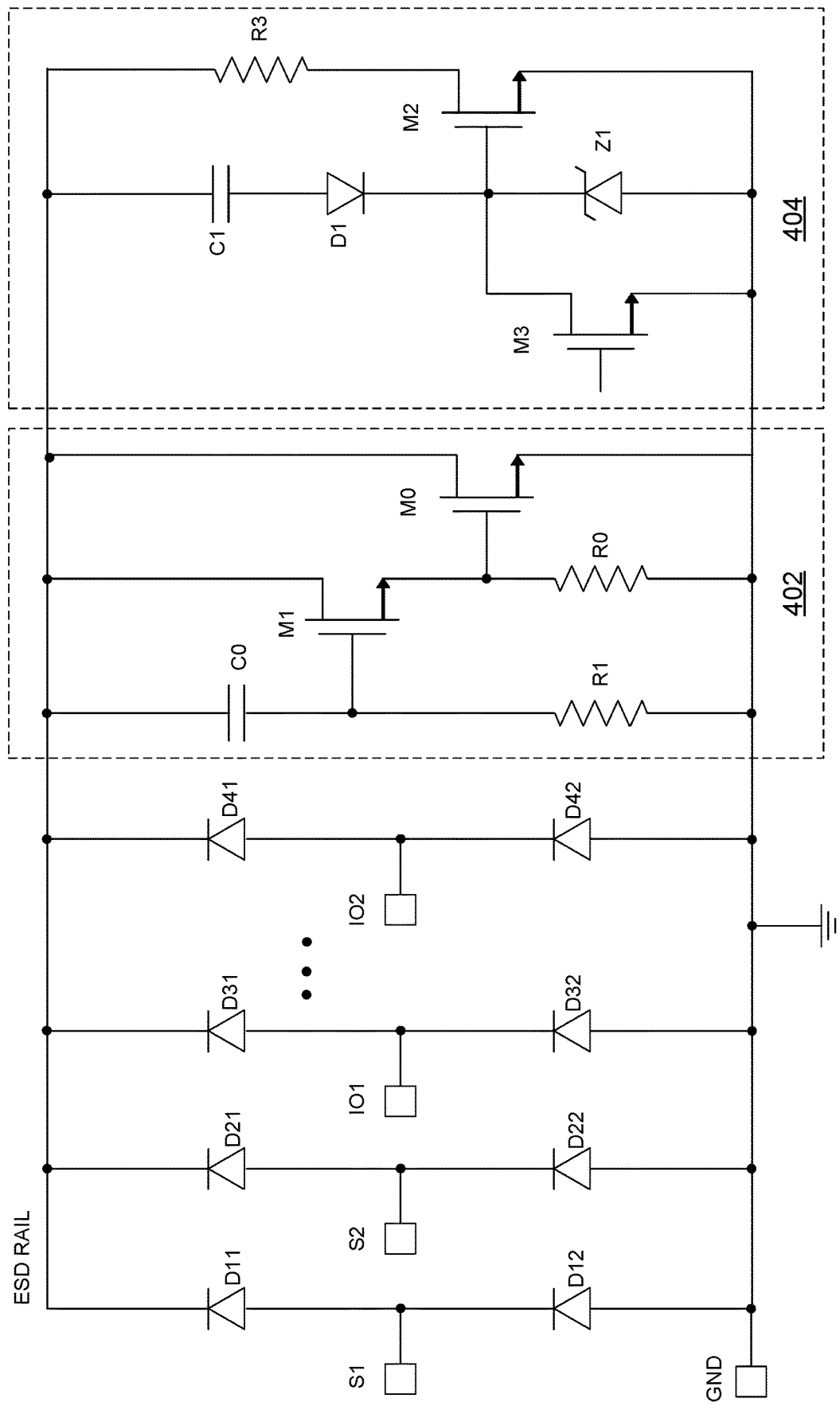
FIG. 6 illustrates a schematic diagram of a third implementation of an ESD protection apparatus in accordance with various embodiments of the present disclosure.

FIG. 6 illustrates a schematic diagram of a third implementation of an ESD protection apparatus in accordance with various embodiments of the present disclosure. The third implementation of the ESD protection apparatus is similar to the second implementation of the ESD protection apparatus shown in FIG. 5 except that a Zener diode Z1 is connected between the gate of M2 and ground. The Zener diode Z1 is employed to protect the gate of M2 from being damaged due to overvoltage.

Figure 7:
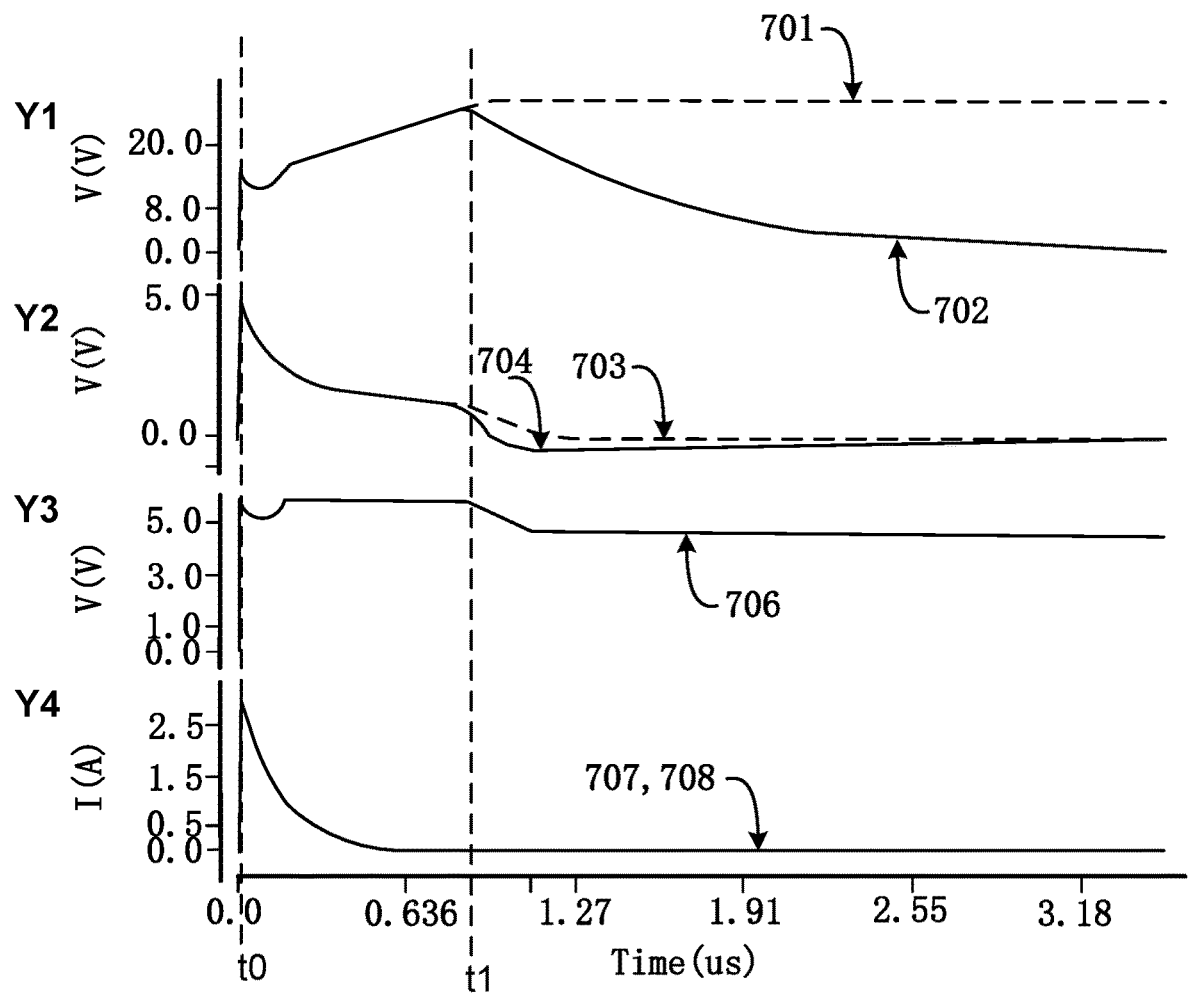
FIG. 7 illustrates a comparison between the ESD protection apparatus shown in FIG. 1 and the ESD protection apparatus shown in FIG. 4 in accordance with various embodiments of the present disclosure.

FIG. 7 illustrates a comparison between the ESD protection apparatus shown in FIG. 1 and the ESD protection apparatus shown in FIG. 4 in accordance with various embodiments of the present disclosure. The horizontal axis of FIG. 7 represents intervals of time. There may be four vertical axes. The first vertical axis Y1 represents the voltage on the ESD rail. The curve 701 represents the voltage on the ESD rail when the ESD protection apparatus shown in FIG. 1 is employed. The curve 702 represents the voltage on the ESD rail when the ESD protection apparatus shown in FIG. 4 is employed. The second vertical axis Y2 represents the gate-to-source voltage of M0. The curve 703 represents the gate-to-source voltage of M0 when the ESD protection apparatus shown in FIG. 1 is employed. The curve 704 represents the gate-to-source voltage of M0 when the ESD protection apparatus shown in FIG. 4 is employed. The third vertical axis Y3 represents the gate-to-source voltage of M2. The curve 706 represents the gate-to-source voltage of M2 when the ESD protection apparatus shown in FIG. 4 is employed. The fourth vertical axis Y4 represents the current flowing through the ESD rail. The curve 707 represents the current flowing through the ESD rail when the ESD protection apparatus shown in FIG. 1 is employed. The curve 708 represents the current flowing through the ESD rail when the ESD protection apparatus shown in FIG. 4 is employed.

At t0, in response to an ESD transient such as an ESD pulse applied to one of the terminals of the semiconductor chip, the voltage on the ESD rail increases rapidly up to a voltage level of about 15 volts. The gate voltages of M0 and M2 increase rapidly from zero volts to a high voltage (e.g., about 5 volts). In response to the gate voltage changes, both M0 and M2 are turned on. Due to the existence of the current limiting resistor R3, the current flowing through M2 is limited. Since the resistance value of R0 in FIG. 1 is the same as the resistance value of R0 in FIG. 4, the main ESD transistor M0 starts to turn off before the ESD pulse ends. Such an early turn-off causes the remaining energy of the ESD pulse to continue to accumulate on the ESD rail as indicated by the curve 701.

As shown in FIG. 7, the voltage on the ESD rail decreases in a short period of time, and then continues to rise until it reaches a stable voltage of about 25 volts at t1 (the end of the ESD pulse). At this time, in the ESD protection circuit in FIG. 1, because there are no other discharge paths, the voltage of the ESD rail stays at about 25 volts. If there is a subsequent ESD pulse, the ESD protection circuit may not be activated unless the voltage of the ESD pulse is higher than 25 volts. If M0 continues to be turned off before the end of the ESD pulse, the voltage on the ESD rail will continue to accumulate until the circuits connected to the terminals are damaged due to overvoltage. In contrast, in the ESD protection circuit shown in FIG. 4, due to the addition of the second ESD discharge path formed by R3 and M2, after M0 has been turned off, M2 remains on. After t1, M2 can continue to discharge the ESD rail as shown by the curve 702.

In practical applications, the discharge duration of the ESD rail can be adjusted by selecting the value of the resistor R2 or controlling the turn on timing of the auxiliary transistor M3. In particular, the ESD rail can be fully discharged before the next ESD pulse starts. The discharge speed of the ESD rail can also be adjusted by configuring the value of the current limiting resistor R3. It should be noted that the hot-swap power supply application should be considered when selecting the value of the current limiting resistor R3. The value of R3 should be determined such that the current flowing through M2 is limited to a level under which the diode connected between the ESD rail and the terminal will not be damaged due to overheating.

Figure 8:
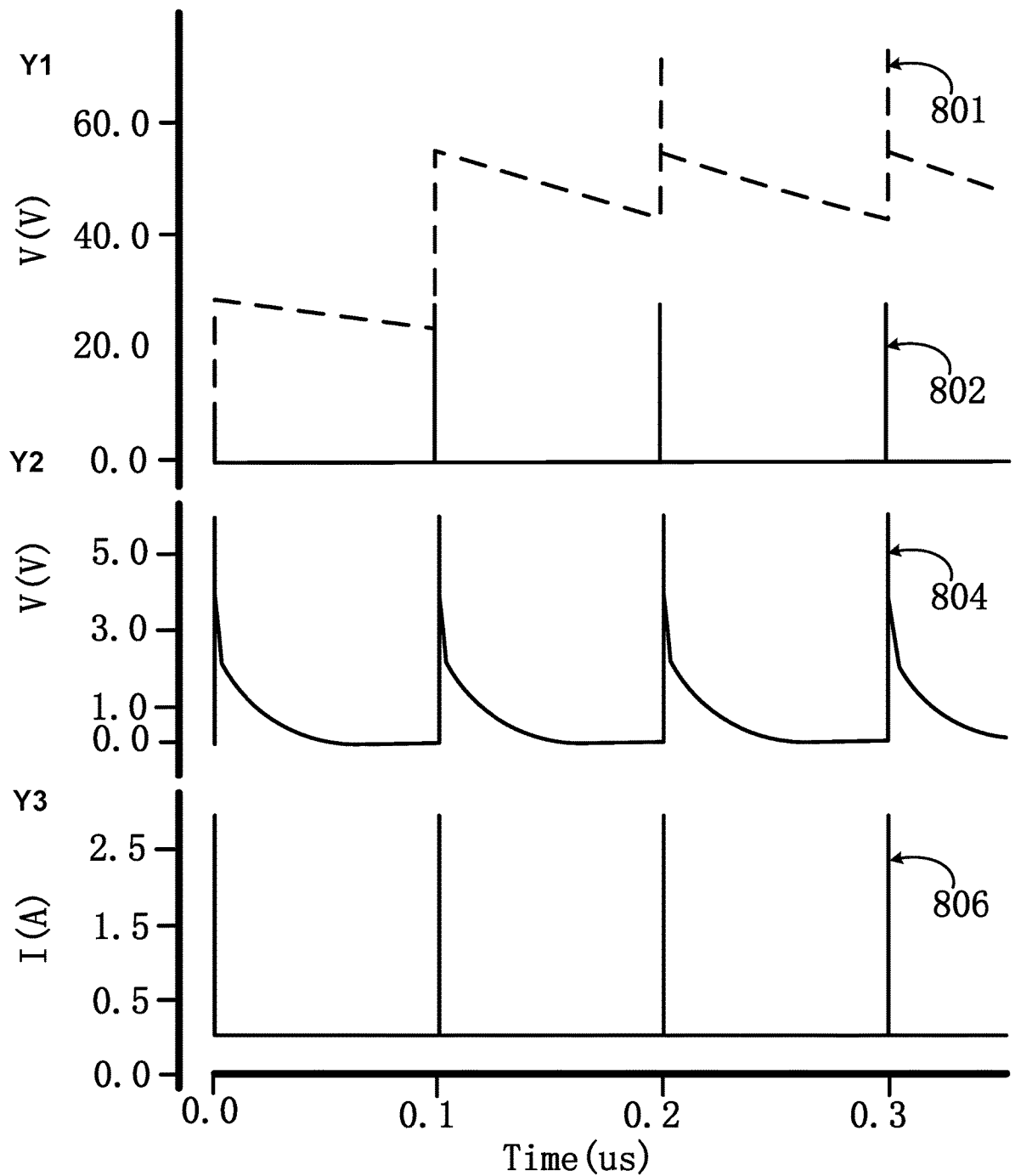
FIG. 8 illustrates another comparison between the ESD protection apparatus shown in FIG. 1 and the ESD protection apparatus shown in FIG. 4 in accordance with various embodiments of the present disclosure.

FIG. 8 illustrates another comparison between the ESD protection apparatus shown in FIG. 1 and the ESD protection apparatus shown in FIG. 4 in accordance with various embodiments of the present disclosure. The horizontal axis of FIG. 8 represents intervals of time. There may be three vertical axes. The first vertical axis Y1 represents the voltage on the ESD rail. The curve 801 represents the voltage on the ESD rail when the ESD protection apparatus shown in FIG. 1 is employed. The curve 802 represents the voltage on the ESD rail when the ESD protection apparatus shown in FIG. 4 is employed. The second vertical axis Y2 represents the gate-to-source voltage of M2. The curve 804 represents the gate-to-source voltage of M2 when the ESD protection apparatus shown in FIG. 4 is employed. The third vertical axis Y3 represents the current flowing through the ESD rail. The curve 806 represents the current flowing through the ESD rail when the ESD protection apparatus shown in FIG. 4 is employed.

FIG. 8 shows a comparison of the responses shown in FIG. 7 over a longer time period. As indicated by the curve 801, when the second ESD discharge path is not employed, the voltage on the ESD rail in FIG. 1 continues to rise with the input of each ESD pulse until it exceeds the circuit rating voltage (e.g., 60 volts), causing the circuit to be damaged. After adding the second ESD discharge path (R3 and M2) shown in FIG. 4, since the gate voltage of M2 drops relatively slowly, the continuous conduction time of the M2 is also long. As a result, the ESD rail can be fully discharged before the next ESD pulse occurs. As indicated by the curve 802, the charge cannot be accumulated on the ESD rail.

Figure 9:
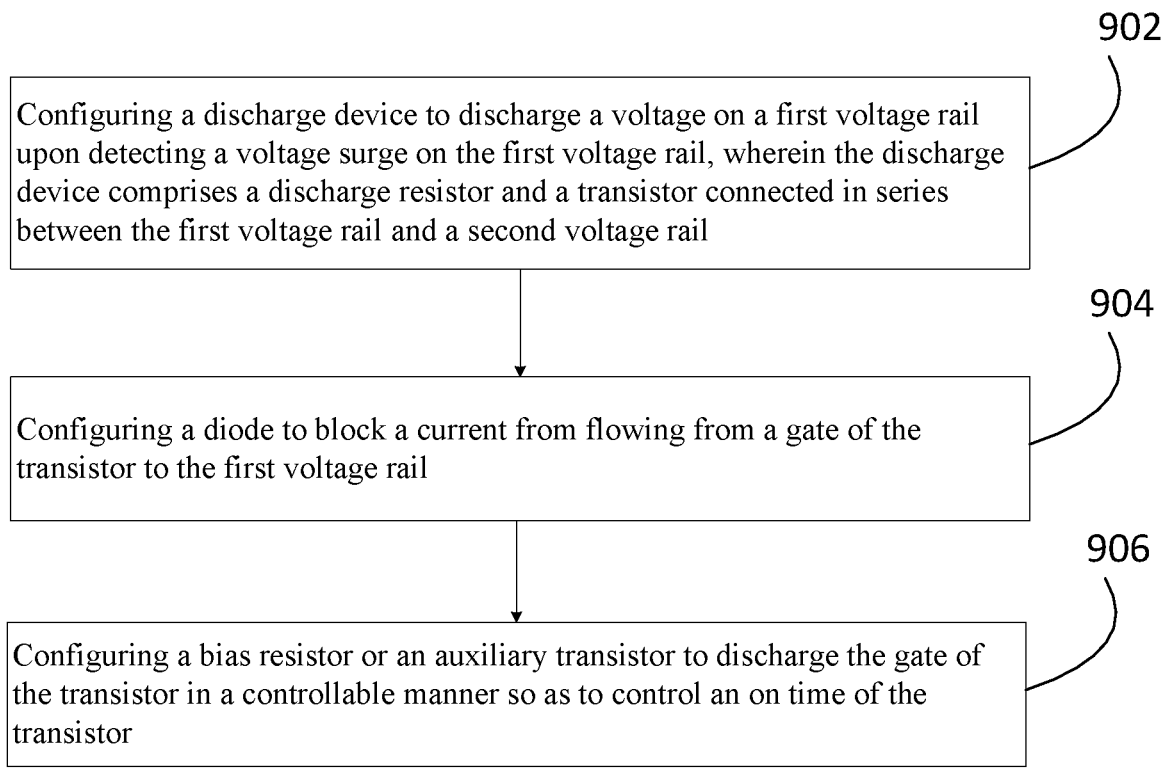
FIG. 9 illustrates a flow chart of a control method for operating the ESD protection apparatus shown in FIG. 4 in accordance with various embodiments of the present disclosure.

FIG. 9 illustrates a flow chart of a control method for operating the ESD protection apparatus shown in FIG. 4 in accordance with various embodiments of the present disclosure. This flowchart shown in FIG. 9 is merely an example, which should not unduly limit the scope of the claims. One of ordinary skill in the art would recognize many variations, alternatives, and modifications. For example, various steps illustrated in FIG. 9 may be added, removed, replaced, rearranged and repeated.

Referring back to FIG. 4, an ESD protection apparatus comprises two ESD discharge paths. A first ESD discharge path is formed by C0, R1, M1, R0 and M0. The first ESD discharge path is the same as the traditional ESD protection apparatus shown in FIG. 1. A second ESD discharge path is formed by C1, D1, R2, M3, R3 and M2. In operation, the control circuit of the second ESD discharge path is configured such that upon detecting an ESD voltage surge, the on time of the second ESD discharge path is greater than the on time of the first ESD discharge path.

At step 902, a discharge device is configured to discharge a voltage on a first voltage rail upon detecting a voltage surge on the first voltage rail. The discharge device comprises a discharge resistor and a transistor connected in series between the first voltage rail and a second voltage rail.

At step 904, a diode is configured to block a current from flowing from a gate of the transistor to the first voltage rail.

At step 906, a bias resistor or an auxiliary transistor is configured to discharge the gate of the transistor in a controllable manner so as to control an on time of the transistor.

The method further comprises configuring an ESD device to discharge the voltage on the first voltage rail upon detecting the voltage surge on the first voltage rail, wherein the ESD device and the discharge device are connected in parallel between the first voltage rail and the second voltage rail.

The ESD device comprises an ESD transistor connected between the first voltage rail and the second voltage rail, a drive transistor and a second bias resistor connected in series between the first voltage rail and the second voltage rail, and wherein a common node of the drive transistor and the second bias resistor is connected to a gate of the ESD transistor, and a second coupling capacitor and a third bias resistor connected in series between the first voltage rail and the second voltage rail, and wherein a common node of the second coupling capacitor and the third bias resistor is connected to a gate of the drive transistor.

The ESD transistor is an n-type transistor having a drain connected to the first voltage rail and a source connected to the second voltage rail. The drive transistor is an n-type transistor having a drain connected to the first voltage rail and a source connected to the second bias resistor.

The method further comprises configuring the auxiliary transistor to shut down the transistor in response to a shutdown signal, wherein the auxiliary transistor is connected in parallel with the bias resistor.

A first coupling capacitor, the diode and the bias resistor are connected in series between the first voltage rail and the second voltage rail. A common node of the diode and the bias resistor is connected to the gate of the transistor. The first voltage rail is an ESD rail. The second voltage rail is connected to ground. The transistor is an n-type transistor having a drain connected to the discharge resistor and a source connected to ground. An anode of the diode is connected to the first coupling capacitor. A cathode of the diode is connected to the gate of the transistor.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
a discharge resistor and a transistor connected in series between a first voltage rail and a second voltage rail;
a first coupling capacitor and a diode connected in series between the first voltage rail and a gate of the transistor, wherein an anode of the diode is connected to the first coupling capacitor, and a cathode of the diode is connected to the gate of the transistor;
an auxiliary transistor connected between the gate of the transistor and ground; and
an ESD protection device connected between the first voltage rail and the second voltage rail.

2. The apparatus of claim 1, wherein:
the first voltage rail is an ESD rail; and
the second voltage rail is connected to ground.

3. The apparatus of claim 1, further comprising:
a first bias resistor connected in parallel with the auxiliary transistor, wherein the first bias resistor is configured to discharge the gate of the transistor in a controllable manner so as to control an on time of the transistor.

4. The apparatus of claim 1, wherein:
the transistor is an n-type transistor having a drain connected to the discharge resistor and a source connected to ground.

5. The apparatus of claim 1, wherein the ESD protection device comprises:
an ESD transistor connected between the first voltage rail and the second voltage rail;
a drive transistor and a second bias resistor connected in series between the first voltage rail and the second voltage rail, and wherein a common node of the drive transistor and the second bias resistor is connected to a gate of the ESD transistor; and
a second coupling capacitor and a third bias resistor connected in series between the first voltage rail and the second voltage rail, and wherein a common node of the second coupling capacitor and the third bias resistor is connected to a gate of the drive transistor.

6. The apparatus of claim 5, wherein:
the ESD transistor is an n-type transistor having a drain connected to the first voltage rail and a source connected to the second voltage rail.

7. The apparatus of claim 5, wherein:
the drive transistor is an n-type transistor having a drain connected to the first voltage rail and a source connected to the second bias resistor.

8. The apparatus of claim 1, further comprising:
a plurality of first upper diodes connected between the first voltage rail and respective power supply terminals;
a plurality of first lower diodes connected between the respective power supply terminals and the second voltage rail;
a plurality of second upper diodes connected between the first voltage rail and respective signal input/output terminals; and
a plurality of second lower diodes connected between the respective signal input/output terminals and the second voltage rail.

9. The apparatus of claim 8, wherein:
cathodes of the plurality of first upper diodes are connected to the first voltage rail; and
anodes of the plurality of first lower diodes are connected to the second voltage rail.

10. The apparatus of claim 8, wherein:
cathodes of the plurality of second upper diodes are connected to the first voltage rail; and
anodes of the plurality of second lower diodes are connected to the second voltage rail.

11. The apparatus of claim 1, wherein:
the auxiliary transistor is configured to shut down the transistor in response to a shutdown signal.

12. A method comprising:
configuring a discharge device to discharge a voltage on a first voltage rail upon detecting a voltage surge on the first voltage rail, wherein the discharge device comprises a discharge resistor and a transistor connected in series between the first voltage rail and a second voltage rail;

configuring a diode to block a current from flowing from a gate of the transistor to the first voltage rail, wherein an anode of the diode is connected to a first coupling capacitor, and a cathode of the diode is connected to the gate of the transistor; and configuring a bias resistor or an auxiliary transistor to discharge the gate of the transistor in a controllable manner so as to control an on time of the transistor.

13. The method of claim 12, further comprising:
configuring an ESD device to discharge the voltage on the first voltage rail upon detecting the voltage surge on the first voltage rail, wherein the ESD device and the discharge device are connected in parallel between the first voltage rail and the second voltage rail.

14. The method of claim 13, wherein the ESD device comprises:
an ESD transistor connected between the first voltage rail and the second voltage rail;
a drive transistor and a second bias resistor connected in series between the first voltage rail and the second voltage rail, and wherein a common node of the drive transistor and the second bias resistor is connected to a gate of the ESD transistor; and
a second coupling capacitor and a third bias resistor connected in series between the first voltage rail and the second voltage rail, and wherein a common node of the second coupling capacitor and the third bias resistor is connected to a gate of the drive transistor.

15. The method of claim 14, wherein:
the ESD transistor is an n-type transistor having a drain connected to the first voltage rail and a source connected to the second voltage rail; and
the drive transistor is an n-type transistor having a drain connected to the first voltage rail and a source connected to the second bias resistor.

16. The method of claim 12, further comprising:
configuring the auxiliary transistor to shut down the transistor in response to a shutdown signal, wherein the auxiliary transistor is connected in parallel with the bias resistor.

17. The method of claim 12, wherein:
the first coupling capacitor, the diode and the bias resistor are connected in series between the first voltage rail and the second voltage rail, and wherein a common node of the diode and the bias resistor is connected to the gate of the transistor, and wherein:
the first voltage rail is an ESD rail;
the second voltage rail is connected to ground;
the transistor is an n-type transistor having a drain connected to the discharge resistor and a source connected to ground.

18. A semiconductor chip comprising:
a plurality of power supply terminals;
a plurality of first upper diodes and a plurality of first lower diodes connected in series between a first voltage rail and a second voltage rail, wherein a common node of a first upper diode and a first lower diode adjacent to the first upper diode is connected to a corresponding power supply terminal;
a plurality of signal input/output terminals;
a plurality of second upper diodes and a plurality of second lower diodes connected in series between the first voltage rail and the second voltage rail, wherein a common node of a second upper diode and a second lower diode adjacent to the second upper diode is connected to a corresponding signal input/output terminal;
an ESD protection device connected between the first voltage rail and the second voltage rail; and
an auxiliary ESD protection device connected between the first voltage rail and the second voltage rail, wherein in response to a voltage surge on the first voltage rail, an on time of the auxiliary ESD protection device is greater than an on time of the ESD protection device, wherein the auxiliary ESD protection device comprises a discharge resistor and a transistor connected in series between the first voltage rail and the second voltage rail, and a first coupling capacitor and a diode connected in series between the first voltage rail and a gate of the transistor, and wherein an anode of the diode is connected to the first coupling capacitor, and a cathode of the diode is connected to the gate of the transistor.

19. The semiconductor chip of claim 18, wherein
the first coupling capacitor, the diode and an auxiliary transistor are connected in series between the first voltage rail and the second voltage rail, wherein a common node of the diode and the auxiliary transistor is connected to the gate of the transistor, and wherein the auxiliary transistor is configured to shut down the transistor in response to a shutdown signal.

20. The semiconductor chip of claim 18, wherein the ESD protection device comprises:
an ESD transistor connected between the first voltage rail and the second voltage rail;
a drive transistor and a second bias resistor connected in series between the first voltage rail and the second voltage rail, and wherein a common node of the drive transistor and the second bias resistor is connected to a gate of the ESD transistor; and
a second coupling capacitor and a third bias resistor connected in series between the first voltage rail and the second voltage rail, and wherein a common node of the second coupling capacitor and the third bias resistor is connected to a gate of the drive transistor.

* * * * *